(12) United States Patent
Zielinski

(10) Patent No.: US 11,248,574 B2
(45) Date of Patent: Feb. 15, 2022

(54) METHODS AND SYSTEMS FOR DIAGNOSING A VALVE

(71) Applicant: Transportation IP Holdings, LLC, Norwalk, CT (US)

(72) Inventor: David Zielinski, Erie, PA (US)

(73) Assignee: TRANSPORTATION IP HOLDINGS, LLC, Norwalk, CT (US)

( * ) Notice: Subject to any disclaimer, the term of this patent is extended or adjusted under 35 U.S.C. 154(b) by 0 days.

(21) Appl. No.: 17/327,472

(22) Filed: May 21, 2021

(65) Prior Publication Data

US 2021/0396199 A1 Dec. 23, 2021

Related U.S. Application Data

(60) Provisional application No. 63/042,924, filed on Jun. 23, 2020.

(51) Int. Cl.
| | |
|---|---|
| *G06F 1/00* | (2006.01) |
| *F02M 59/46* | (2006.01) |
| *F02D 41/22* | (2006.01) |
| *G01R 19/00* | (2006.01) |

(52) U.S. Cl.
CPC ........... *F02M 59/466* (2013.01); *F02D 41/22* (2013.01); *G01R 19/0092* (2013.01); *F02D 2041/224* (2013.01); *F02D 2041/227* (2013.01)

(58) Field of Classification Search
CPC .... F02D 19/025; F02D 19/0623; F02D 41/22; F02D 2041/2086; F02D 2041/227; F02D 2200/04; F02D 19/0636; F02D 2041/224; F02M 35/10373
USPC ............ 701/114; 73/114.31, 114.32, 114.38, 73/114.45
See application file for complete search history.

(56) References Cited

U.S. PATENT DOCUMENTS

| | | | |
|---|---|---|---|
| 10,526,994 B2 * | 1/2020 | Taxon | F02M 59/367 |
| 10,731,592 B2 * | 8/2020 | Chia | F02D 41/20 |
| 2016/0084181 A1 * | 3/2016 | Henry | F02M 26/08 |
| | | | 123/568.21 |
| 2019/0309700 A1 * | 10/2019 | Chia | F02M 59/368 |

* cited by examiner

*Primary Examiner* — John Kwon
(74) *Attorney, Agent, or Firm* — McCoy Russell LLP

(57) ABSTRACT

Various methods and systems are provided for health assessments of a fuel system. In one example, a method for an inlet metering valve (IMV) includes reducing electrical driving of the IMV, monitoring a response time of the IMV in real-time responsive to the reducing, and determining if the IMV is degraded based on a response of IMV current over a duration, the duration beginning after an initial decrease in current caused by the reducing.

20 Claims, 11 Drawing Sheets

METHODS AND SYSTEMS FOR DIAGNOSING A VALVE

CROSS-REFERENCE TO RELATED APPLICATIONS

The present application claims priority to U.S. Provisional Application No. 63/042,924, entitled "METHODS AND SYSTEMS FOR DIAGNOSING AN INLET METERING VALVE IN A FUEL SYSTEM," and filed on Jun. 23, 2020. The entirety of the above-listed application is hereby incorporated by reference for all purposes.

BACKGROUND

Technical Field

Embodiments of the subject matter disclosed herein relate to a valve diagnostic system and method.

Discussion of Art

Vehicles, such as rail vehicles, include power sources, such as reciprocating internal combustion diesel engines. In some vehicles, fuel is provided to the diesel engine by a common rail fuel system. One type of common rail fuel system includes a low-pressure fuel pump in fluidic communication with a high-pressure fuel pump, and a fuel rail in fluidic communication with the high-pressure fuel pump. The fuel rail may also be in fluidic communication with at least one fuel injector coupled to an engine cylinder. The high-pressure fuel pump pressurizes fuel for delivery to the fuel injector through the fuel rail where fuel travels to at least one fuel injector and ultimately to at least one engine cylinder of the power source, e.g., the engine. At the engine cylinder, fuel is combusted to provide power to the vehicle.

In order to reduce the likelihood of engine degradation and/or consequential engine damage caused by pump deterioration, the fuel system may be monitored for changes (increase/decrease) in fuel injection quantity with reference to pre-set/commanded fuel injection volume, fuel leaks, degraded components, and/or other issues. For example, fuel flow reductions upstream of the fuel rail may be caused by a degraded inlet metering valve (IMV) or by a degraded high-pressure fuel pump (HPFP), but the IMV may automatically and erroneously be identified as the degraded component. When the flow reduction is instead caused by the high-pressure fuel pump, time and money may be wasted replacing the IMV and/or engine performance may continue to degrade, leading to vehicle operator frustration, increased maintenance costs, stranded vehicles, and customer (such as a railroad company or a marine transport company) dissatisfaction.

BRIEF DESCRIPTION

In one embodiment, a method for an inlet metering valve (IMV) includes reducing electrical driving of the IMV, monitoring a response time of the IMV in real-time responsive to the reducing, and determining if the IMV is degraded based on a response of IMV current over a duration, the duration beginning after an initial decrease in current caused by the reducing. In this way, degradation of the IMV may be confirmed and identification of the IMV as a source of an issue in a fuel system is enabled, decreasing a likelihood that the source of the issue is misdiagnosed.

In one example, the IMV is transitioned from an electrically driven to an electrically undriven state when the electrical driving is reduced. By sampling a current decay signal of a solenoid of the IMV, indexed data points may be obtained, based on predefined levels of current decay. By converting the indexed data points into time constants, a first time interval and a second time interval may be determined and comparison of the time intervals may indicate a condition of the IMV.

DETAILED DESCRIPTION

Figure 1:
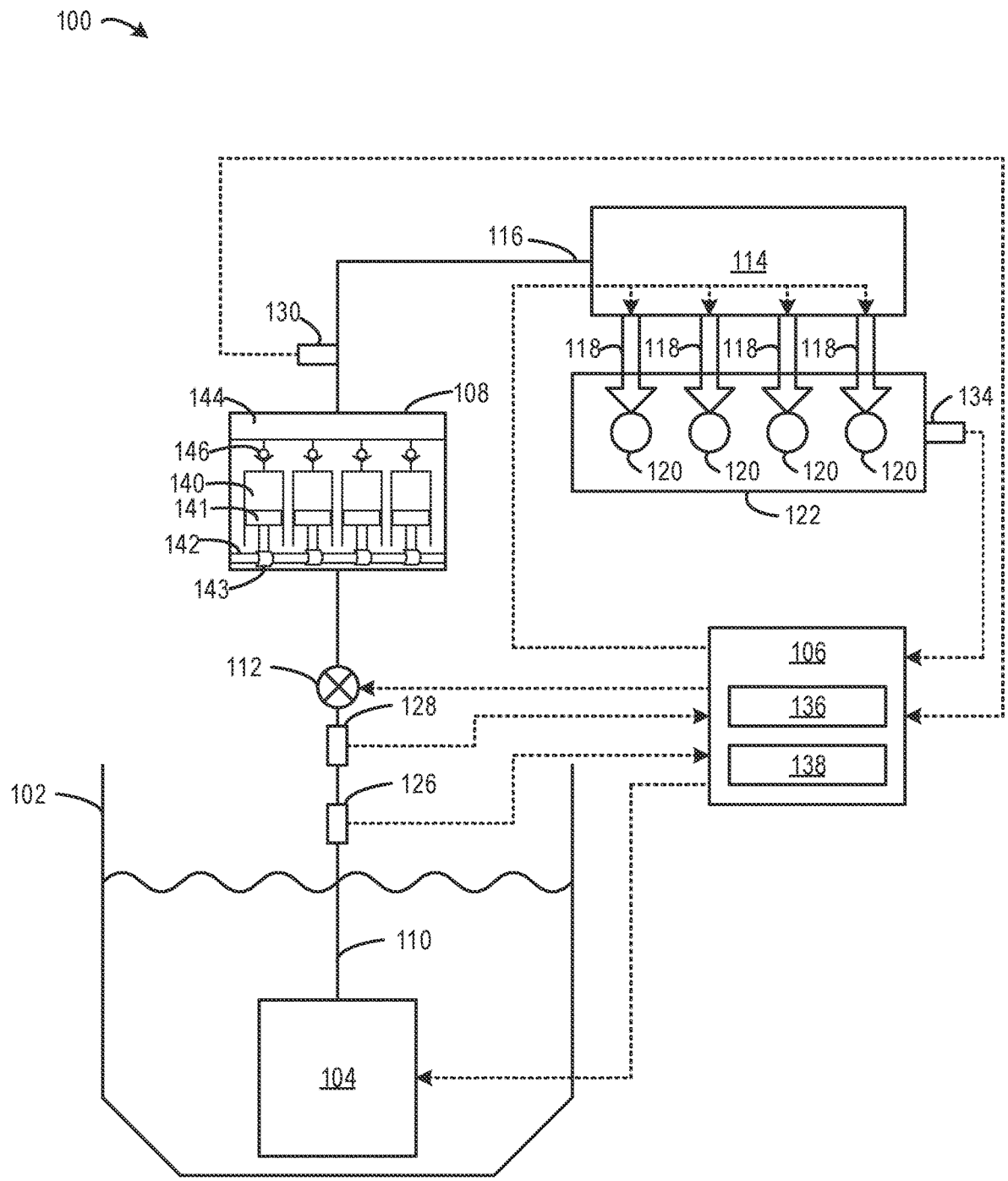
FIG. 1 schematically shows a first embodiment of a common rail fuel system of the present disclosure.
Figure 2:
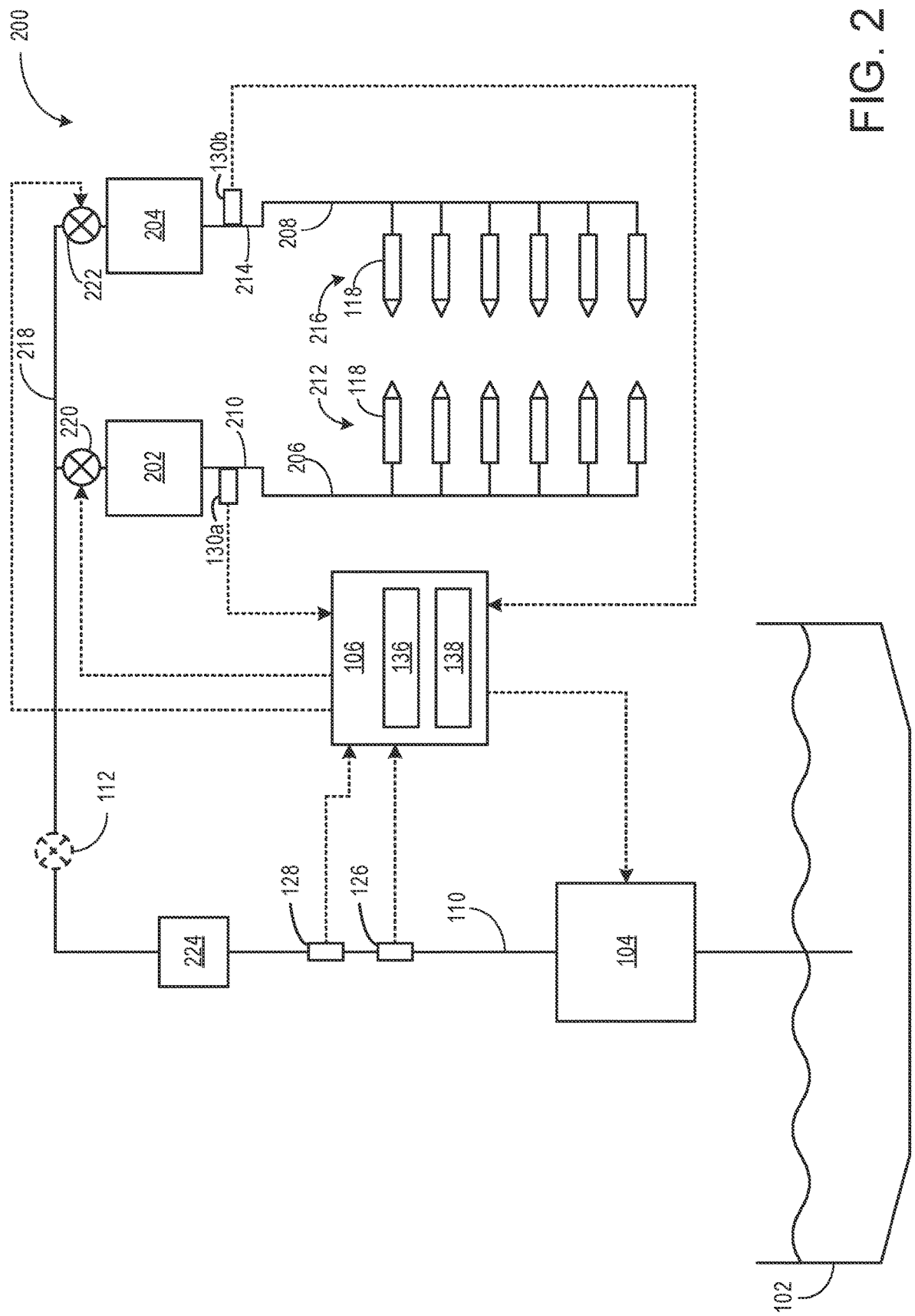
FIG. 2 schematically shows a second embodiment of a common rail fuel system of the present disclosure.
Figure 3:
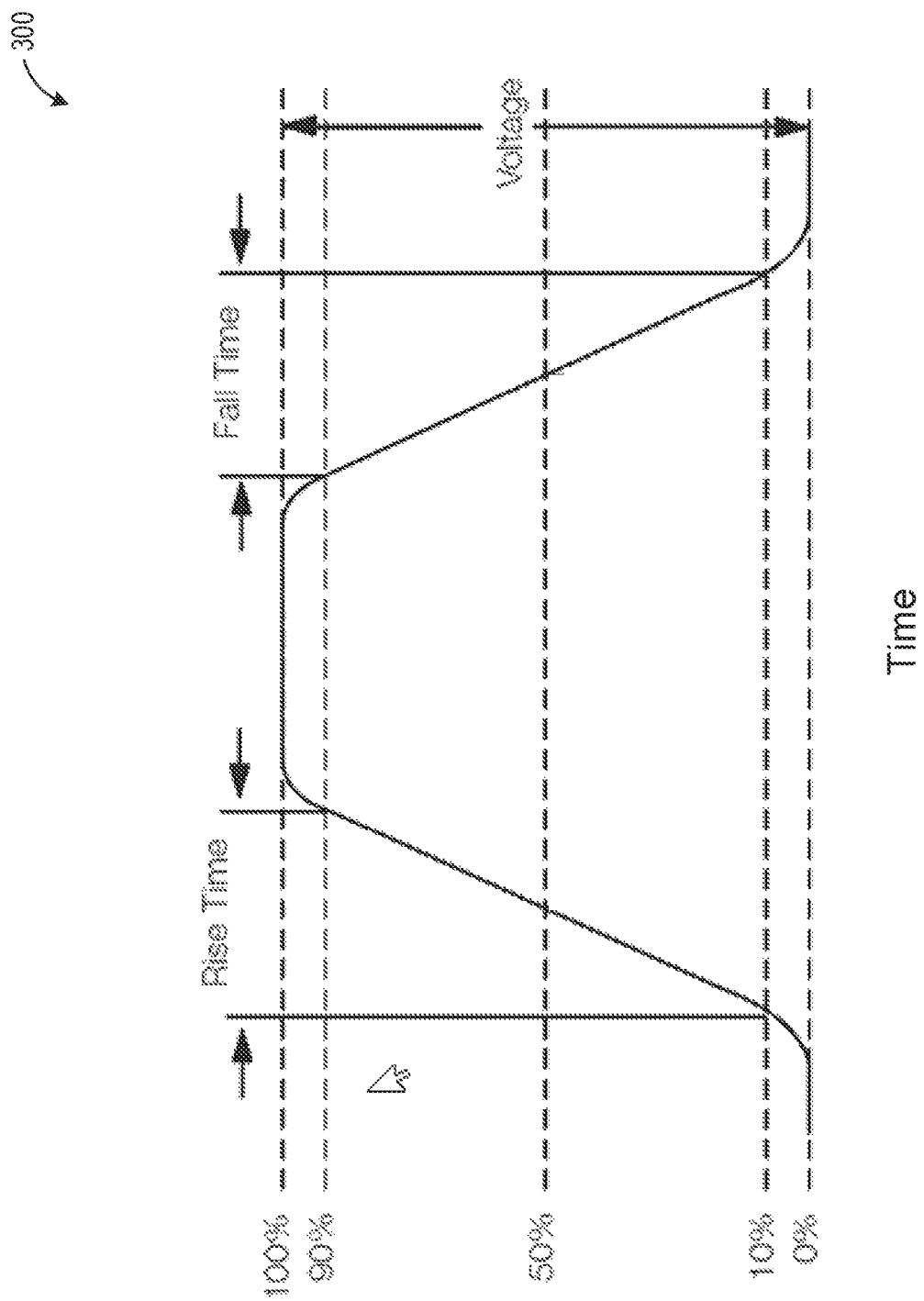
FIG. 3 shows a response time of a solenoid of an inlet metering valve (IMV) which may be implemented in the common rail fuel systems of FIGS. 1 and 2.
Figure 4:
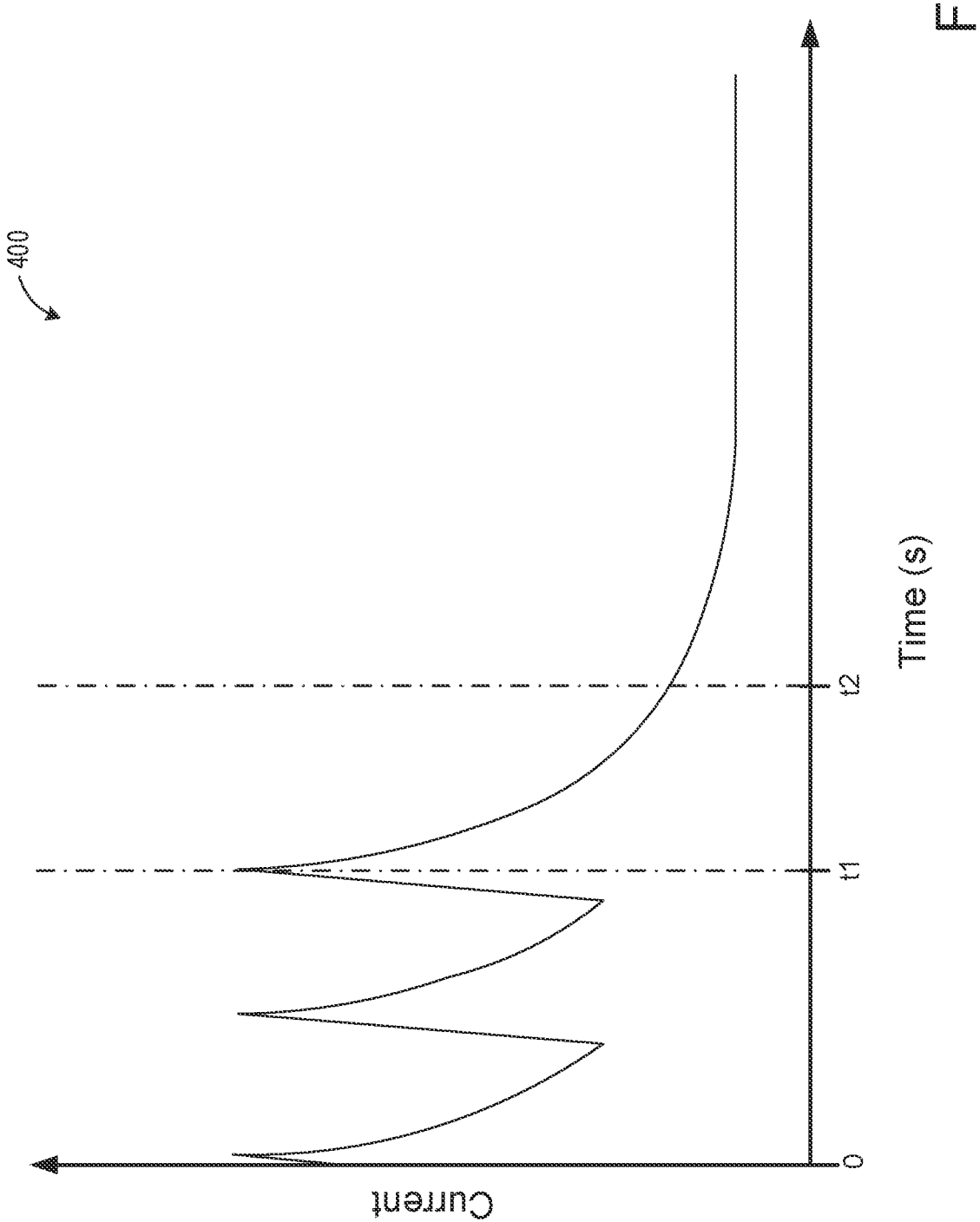
FIG. 4 shows a modeled current decay signal for a solenoid of an IMV.
Figure 5:
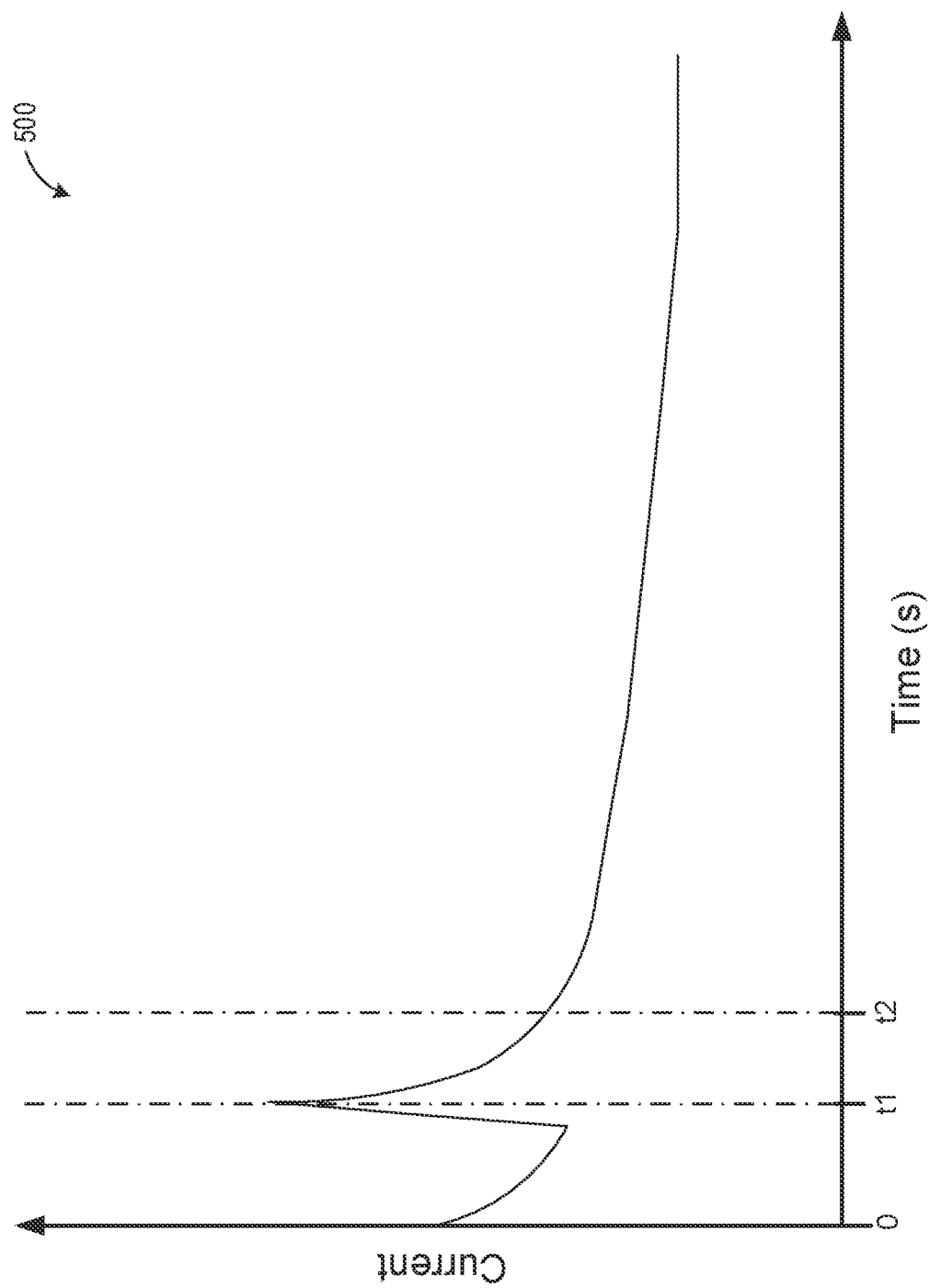
FIG. 5 shows a measured current decay signal for a solenoid of an IMV.
Figure 6:
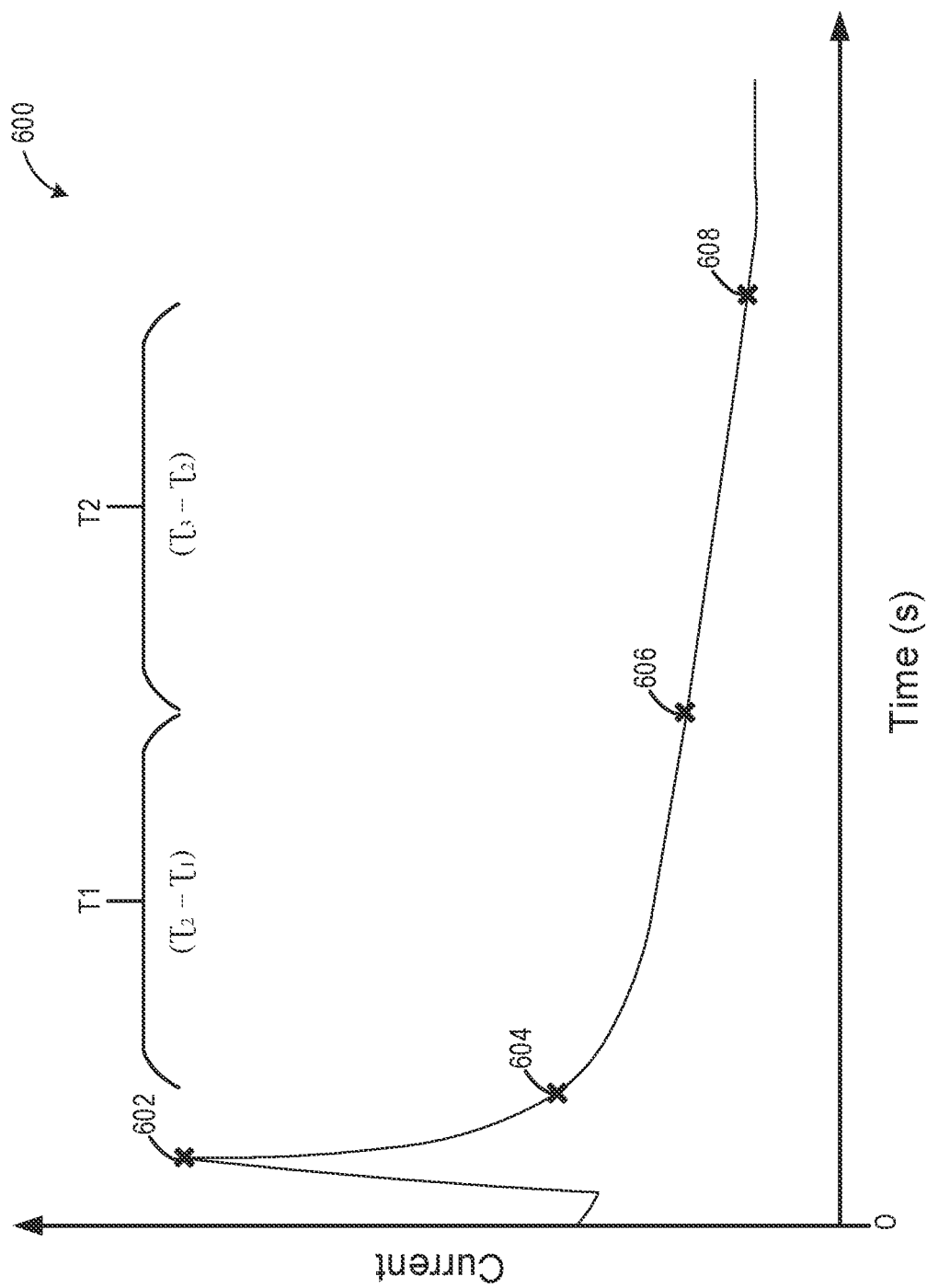
FIG. 6 shows a current decay signal for a solenoid of an IMV with indexed data points.
Figure 7:
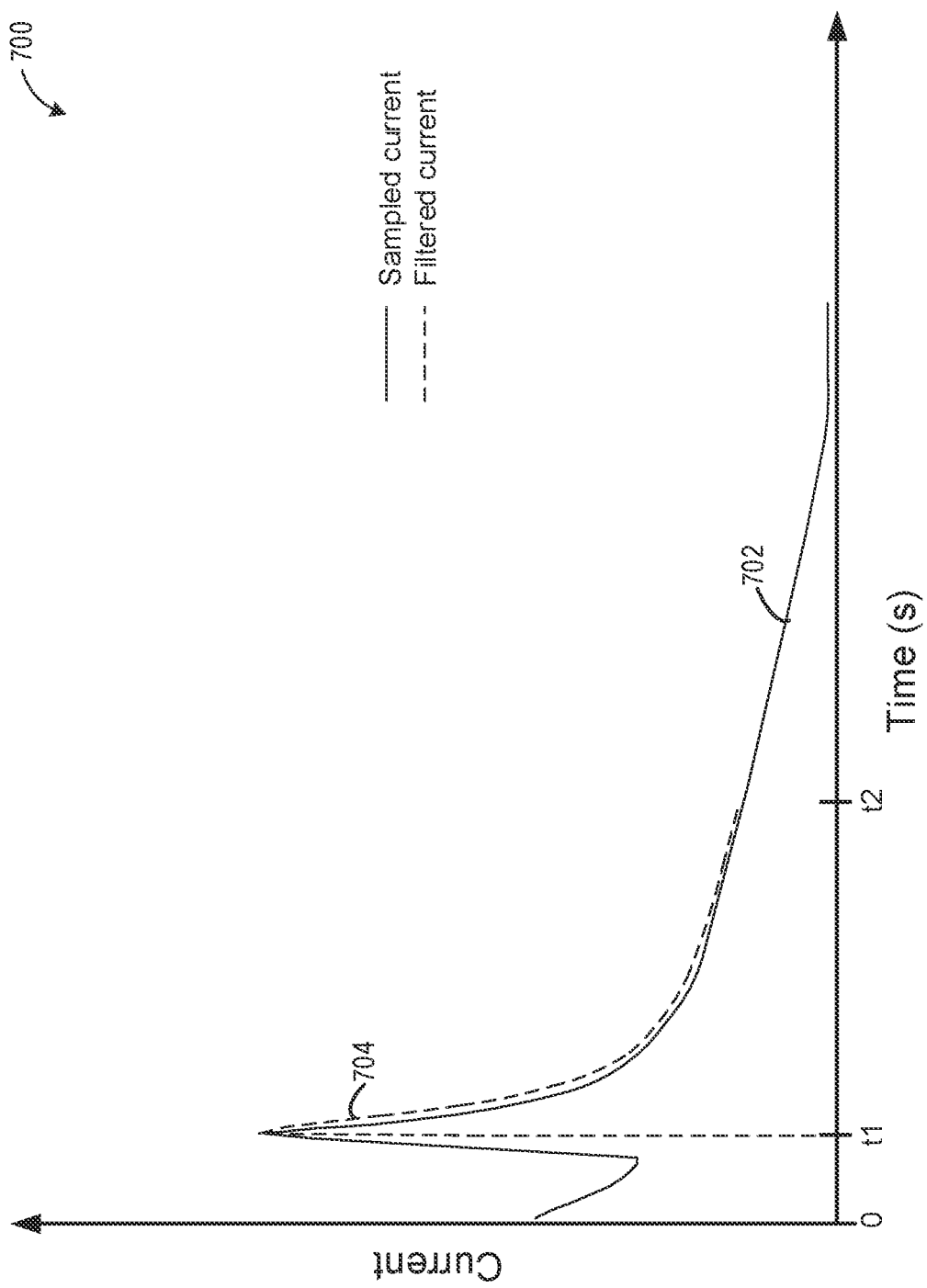
FIG. 7 shows a current decay signal with filtered data for a non-degraded IMV.
Figure 8:
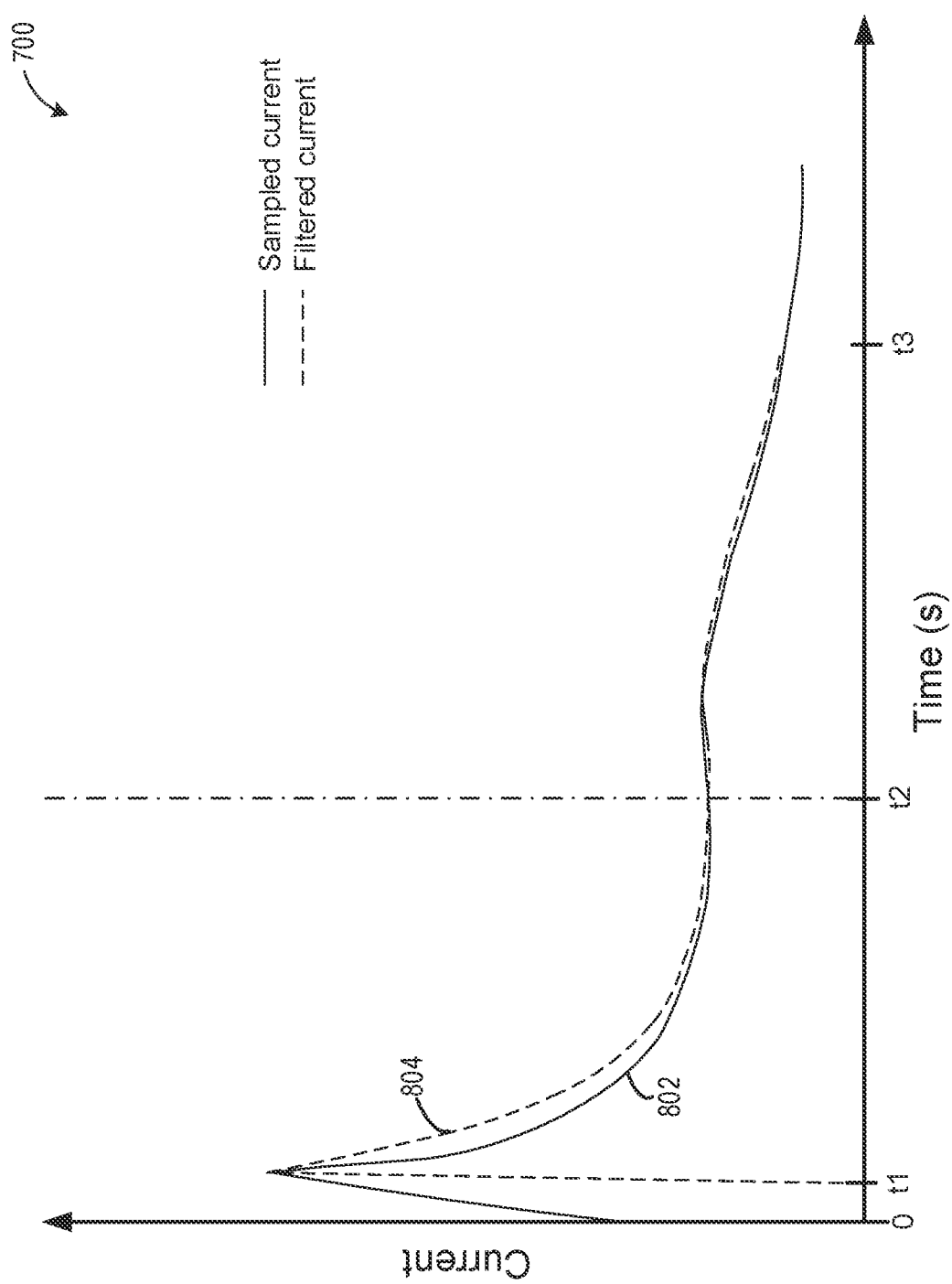
FIG. 8 shows a current decay signal with filtered data for a degraded IMV.
Figure 9:
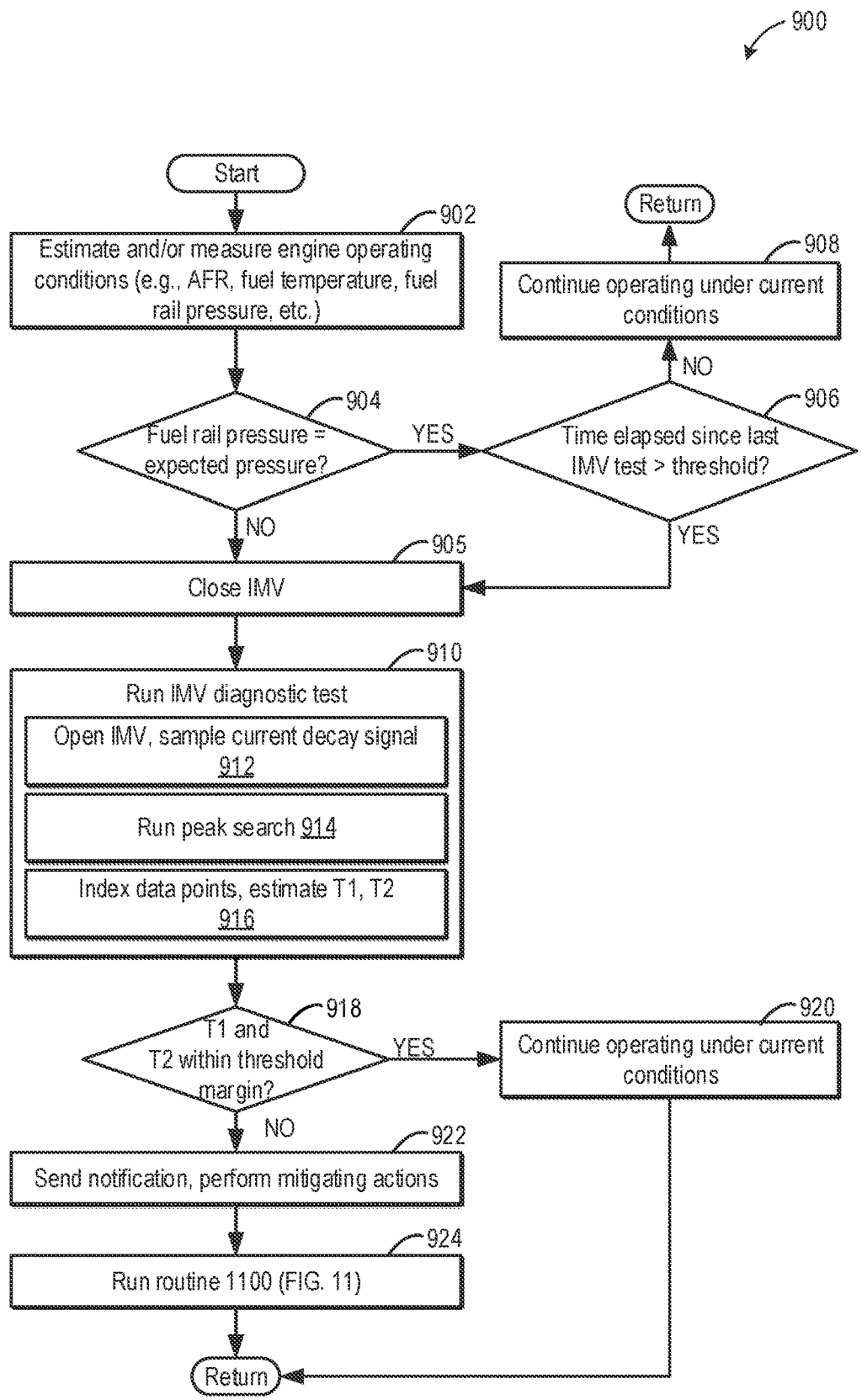
FIG. 9 shows a first example of a routine for diagnosing a condition of an IMV.
Figure 10:
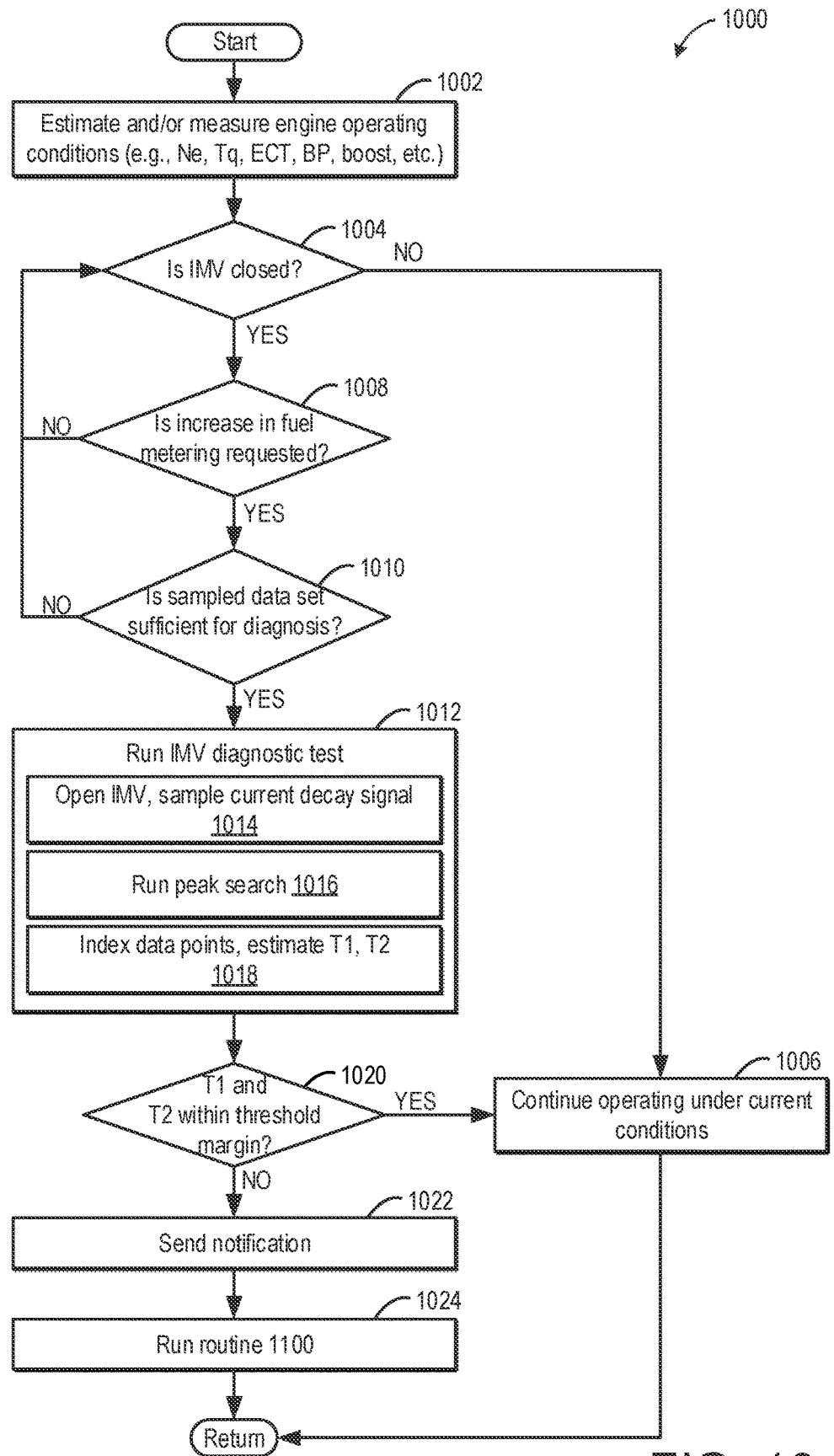
FIG. 10 shows a second example of a routine for diagnosing a condition of an IMV.
Figure 11:
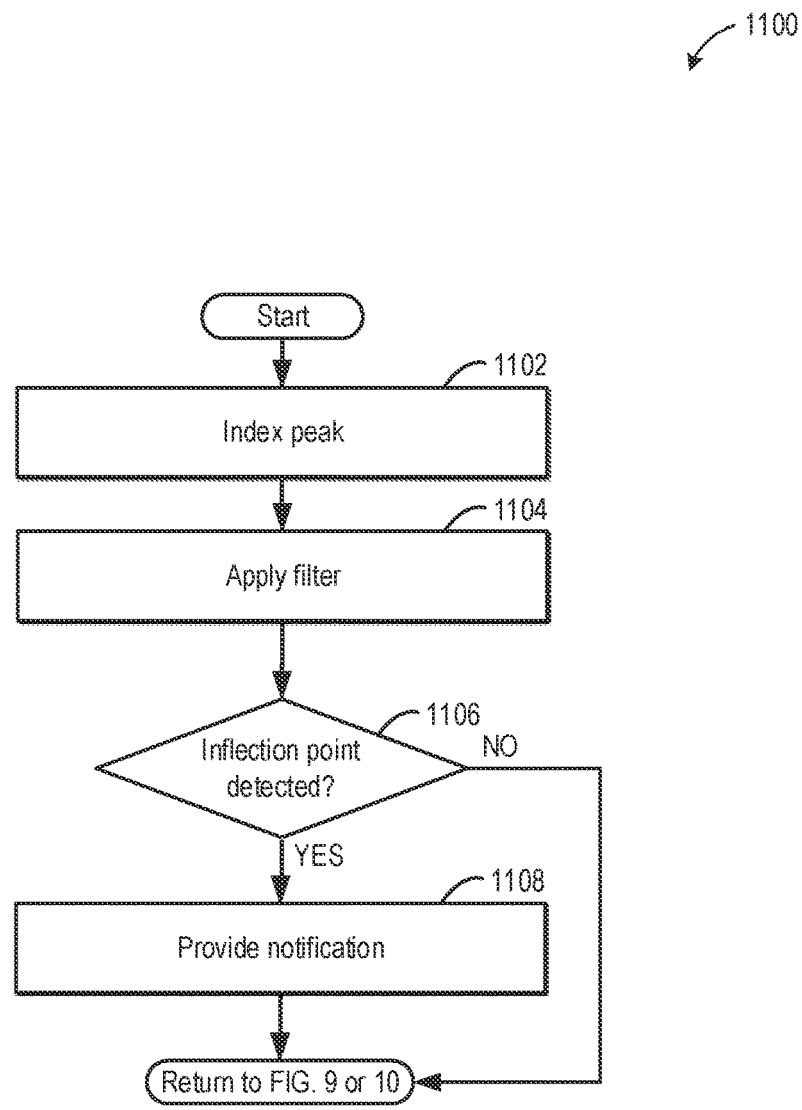
FIG. 11 shows an example of a routine for determining if a solenoid of an IMV is resisting motion.

The following description relates to various embodiments for diagnosing a condition of an inlet metering valve (IMV). The IMV may control an amount of fuel delivered to a high-pressure fuel pump of a fuel system, such as a first example of a common rail fuel system shown in FIG. 1. In some examples, a common rail fuel system may include more than one IMV and high-pressure fuel pump, providing fuel to an engine with more than one cylinder bank, as depicted in FIG. 2. As illustrated in FIG. 3, a solenoid of an IMV may have an expected rise time and fall time during a response of the solenoid to an applied voltage, the voltage driving movement of a plunger of the solenoid. The IMV may, in some instances, become mechanically degraded, resulting in detection of issues with the fuel system. Identification of the IMV as the cause of the issues, rather than the high-pressure fuel pump or leaks in the fuel system, may be provided by monitoring a current decay signal of the IMV when the IMV transitions from an electrically driven state to an electrically undriven state. An expected, modeled response time of the IMV is illustrated in FIG. 4 and an actual, measured response time of the IMV is shown in FIG. 5. Indexing of data points in a response time of the IMV is shown in FIG. 6, the indexing enabling determination of a status of the IMV. Furthermore, the response may be used to determine if the degraded IMV has a stuck/sticky solenoid. As shown in FIGS. 7 and 8, the measured current decay signal of the IMV may be filtered and comparison of the unfiltered signal with the filtered data may indicate whether the solenoid is operating as expected, as depicted in FIG. 7, or resisting movement, as shown in FIG. 8. Examples of routines for diagnosing the IMV for mechanical degradation are shown in FIGS. 9-11.

Before further discussion of the approach for diagnosing the condition, an example of a platform is disclosed in which an engine may be configured for a vehicle. The present description relates to vehicles, such as rail vehicles and marine vessels, that include an engine (such as a reciprocating internal combustion diesel engine) where fuel is provided to the engine through a common rail fuel system (CRFS). As shown in FIG. 1 and described further below, a CRFS includes a common fuel rail that provides fuel to a plurality of fuel injectors for fuel injection into individual cylinders of the engine. In one example, the CRFS includes an inlet metering valve (IMV) that is positioned between a low-pressure fuel pump and a high-pressure fuel pump. The IMV is operable to control fuel flow to the high-pressure fuel pump that supplies the common fuel rail with high pressure fuel. An amount of electrical current supplied to the IMV can be adjusted via an electronic control unit/module (ECU/ECM) to vary the position of the IMV's plunger, and thus effect a variable flow control orifice, hence varying an amount of fuel provided to the common fuel rail as operation conditions of the engine change.

Fuel system characteristic maps (e.g., electrical current applied to achieve a given IMV internal spool/plunger position) may be used as a reference to diagnose fuel system component degradation in addition to controlling rail pressure of the common fuel rail. However, these maps may not accurately differentiate between all sources of high-pressure fuel pump degradation. As such, the default maintenance action performed in response to an indication of high-pressure fuel pump degradation may include replacing the IMV. If the IMV is functional and the degradation is instead due to a degraded high-pressure fuel pump check valve(s) or cam lobe(s), unnecessary maintenance may be performed on the IMV and the vehicle may continue to operate with a degraded high-pressure fuel pump, leading to engine degradation and subsequent engine shut-down. Also, if the IMV is fully functional and the degradation in rail fuel pressure is due to possible degradation of pump piston or pump chamber/cylinder or pump tappet or other components, unnecessary replacement of the IMV, which will otherwise lead to continued degradation in engine operation and subsequent engine shut-down, may be avoided or reduced.

Thus, according to embodiments disclosed herein, a condition of the IMV may be diagnosed by comparing a first order current decay signal of the IMV to a modeled, expected decay signal. A difference in response time between the IMV decay signal and the modeled decay signal may be indicative of IMV degradation, allowing poor IMV performance to be distinguished from pump degradation or a system leak, e.g., a leak in the fuel rail. Furthermore, when the IMV is determined to be mechanically degraded, the IMV may be diagnosed to evaluate whether a solenoid of the IMV is stuck/sticky and/or resisting movement.

FIG. 1 includes a block diagram of a CRFS 100 for an engine of a vehicle. In one example, the vehicle is a rail vehicle, such as a locomotive, or a mining vehicle. In alternative embodiments, the engine may be in another type of off-highway vehicle, on-highway vehicle, stationary power plant, marine vessel, or others. Liquid fuel is sourced or stored in a fuel tank 102. A low-pressure fuel pump 104 is in fluid communication with the fuel tank. In this embodiment, the low-pressure fuel pump is disposed inside of the fuel tank. A suitable fuel pump can be immersed below the liquid fuel level. In alternative embodiments, the low-pressure fuel pump may be coupled to the outside of the fuel tank and pump fuel through a suction device or feature. Operation of the low-pressure fuel pump is regulated or controlled by a controller 106. Suitable controllers may include an engine control unit (ECU or ECM). A suitable low-pressure fuel pump may be selected from engine driven (through cam, gear, belt, chain or such other drive mechanism), independently electrically driven, or hydraulically driven pumps.

The liquid fuel may be pumped by the low-pressure fuel pump from the fuel tank to a high-pressure fuel pump 108 through a conduit 110. A valve 112 may be disposed in the conduit. A suitable valve may regulate fuel flow through the conduit. In one example, the valve may be an inlet metering valve (IMV). The IMV may be disposed upstream of the high-pressure fuel pump to adjust a flow rate, and to meter a suitable quantity, of fuel that may be provided to the high-pressure fuel pump. The fuel may be provided further to a common fuel rail 114. The common fuel rail may distribute the liquid fuel to a plurality of fuel injectors 118. At the plurality of fuel injectors, fuel may be injected into the engine cylinders.

For example, a suitable IMV may be a proportional solenoid valve or proportional spool valve. The valve may function by opening and closing, which is regulated by the controller. The controller commands the IMV to be fully closed, fully open, or at a position between fully closed and fully opened. In this way, the controller may control fuel flow to the high-pressure fuel pump at a commanded fuel flow rate using the IMV. During operation of the vehicle/engine, the IMV is adjusted to meter fuel based on operating conditions, and during at least some conditions may be at least partially open. For example, a position or state of the IMV may be electrically controlled by controlling an IMV electrical current. As another example, a position or state of the IMV may be mechanically, hydraulically, hydro-mechanically, electrically, electro-mechanically, magnetically, or electro-magnetically controlled by controlling a servo motor that adjusts the IMV. The solenoid-based IMV is one example of a control device for metering fuel. In other embodiments a suitable control element may be selected and employed based on application specific criteria.

The high-pressure fuel pump may increase fuel pressure from a lower pressure to a higher pressure. The high-pressure fuel pump is fluidly coupled with the common fuel rail. The high-pressure fuel pump delivers fuel to the common fuel rail through a conduit 116. In the example illustrated in FIG. 1, the high-pressure fuel pump is a multi-piston pump that includes a plurality of pumping chambers. Each pumping chamber may have a cylinder with each cylinder housing a piston and check valve.

The cylinders of the pump may be selected radially, axially, or in-line based at least in part on the selected engine design and desired operational parameters. As shown, the pump includes four pumping chambers (e.g., four pistons, one in each of four cylinders) arranged inline, each pumping chamber including a cylinder 140 that houses a piston 141. The pistons may be actuated by respective cam lobes 143 which are part of an integral camshaft 142 housed inside the pump. The camshaft may be driven by the engine via a drive-mechanism as described herein. Actuation of the pistons may cause suction and resultant discharge of fuel to an accumulator 144 with both fuel suction and discharge each occurring through a separate check valve. Fuel in the accumulator is then pushed out through the check valve(s) to the conduit and then to the fuel rail.

Each pumping chamber may include a respective check valve 146 that may open to allow pressurized fuel to enter the rail and prevent backflow of fuel from the fuel rail into the pump cylinder. In one example, the high-pressure fuel pump includes four pumping chambers (and four corresponding check valves) and the engine includes 16 cylinders. Each cam may include two lobes, such that each piston is actuated twice for each full rotation of the pump drive shaft.

The pump drive shaft may be driven by the crankshaft of the engine using a drive-mechanism as described herein. In one example, one actuation of a piston of the pump may occur for each combustion event in the engine. As an example, for each rotation of the crankshaft of the engine, eight cylinders may fire and eight pump piston actuation events may occur. Other possible configurations include: (a) more than one HP pump in the system; (b) each pump being driven by the engine camshaft; (c) each pump being driven by a gear such that the pump rotates at a multiple of engine crankshaft speed, so as to match its output to engine fuel requirements based on maximum engine speed and loading and maximum allowable pump speed; and (d) the engine has 6, 8, 12, or more cylinders.

A plurality of fuel injectors 118 are in fluidic communication with the common fuel rail. Each of the plurality of fuel injectors may deliver fuel to one of a plurality of engine cylinders 120 in an engine 122. Fuel is combusted in the plurality of engine cylinders to provide power to the vehicle through an alternator and traction motors, for example. Operation of the plurality of fuel injectors is regulated by the controller. In the embodiment of FIG. 1, the engine may include four fuel injectors and four engine cylinders. In alternate embodiments, more or fewer fuel injectors and engine cylinders can be included in a selected engine.

In some implementations, the common fuel rail is a single-walled fuel rail. The CRFS also may include single-walled conduits (e.g., conduit could be single-walled) for delivering fuel to the fuel rail. The single-walled configuration may be employed to reduce production costs as well as to reduce weight of the CRFS, relative to a double-walled configuration.

Fuel pumped from the fuel tank to an inlet of the IMV by the low-pressure fuel pump may operate at what is referred to as a lower fuel pressure or supply fuel pressure. Correspondingly, components of the CRFS which are upstream of the high-pressure fuel pump operate in a lower fuel pressure or supply fuel pressure region. On the other hand, the high-pressure fuel pump may pump fuel from the lower fuel pressure to a higher fuel pressure or rail fuel pressure. Correspondingly, components of the CRFS which are downstream of the high-pressure fuel pump are in a higher-fuel pressure or rail fuel pressure region of the CRFS. In high pressure common rail fuel systems such as the system according to the disclosure, the rail fuel pressure may be close to or slightly higher than the final fuel pressure at which the fuel is injected into each engine cylinder.

A fuel pressure in the lower fuel pressure region is measured by a pressure sensor 126 that is positioned in the conduit. The pressure sensor sends a pressure signal to the controller. In an alternative application, the pressure sensor is in fluidic communication with an outlet of the low-pressure fuel pump. A fuel temperature in the lower fuel pressure region is measured by a temperature sensor 128 that is positioned in conduit and sends a temperature signal to the controller.

A fuel pressure in the higher fuel pressure region is measured by a pressure sensor 130 that is positioned in the conduit and sends a pressure signal to the controller. In an alternative application, the pressure sensor is in fluid communication with an outlet of the high-pressure fuel pump. Note that in some applications various operating parameters may be determined or derived indirectly in addition to or as opposed to being measured directly.

In addition to the sensors mentioned above, the controller receives various signals from a plurality of engine sensors 134 coupled to the engine. At least some of the sensors may be used for assessment of fuel control health and associated engine operation. For example, the controller receives sensor signals indicative of engine in-cylinder air-fuel ratio, engine speed, engine load, engine temperature, ambient temperature, fuel value, a number of cylinders actively combusting fuel, etc. In the illustrated implementation, the controller is a computing device, such as a microcomputer that includes a processor unit 136, non-transitory computer-readable storage medium device 138, input/output ports, memory, and a data bus. The computer-readable storage medium included in the controller is programmable with computer readable data representing instructions executable by the processor for performing the control routines and methods described below as well as other variants that are not specifically listed.

The controller is operable to adjust various actuators in the CRFS based on different operating parameters received or derived from different signals acquired from the various sensors, to dynamically assess the health of the CRFS and control operation of the engine based on the assessment. For example, in an embodiment, the controller is operable to analyze output from the pressure sensor in order to diagnose and indicate a degradation condition of the high-pressure fuel pump.

In some implementations, a response to the degradation condition may include shutting down the engine. By shutting down the engine, the likelihood of further engine degradation, degraded operability, engine damage, or the like may be reduced. In some implementations, the response to the degradation condition may include setting a diagnostic flag and presenting an indication (e.g., visual or audio) of the degradation condition to an operator. Further, certain types of degradation, such as a worn check valve of the high-pressure fuel pump, may be accounted for by adjustment of engine operating parameters (e.g., closing the IMV more than a determined amount for maintaining lower/decreased rail pressure, to enable engine deration) to achieve the capacity to "limp home" to the nearest service shop, thereby preventing an engine shutdown that could potentially result in an undesirable road failure of the vehicle.

FIG. 2 shows a second example of a fuel system for an engine that includes two banks of cylinders and two high pressure fuel rails. For example, FIG. 2 shows a block diagram of a common rail fuel system (CRFS) 200 for an engine of a vehicle having two cylinder banks (e.g., such as a V-engine), such as a rail vehicle or marine vessel. The CRFS of FIG. 2 may include similar components to those described above with reference to FIG. 1. Thus, similar components have been numbered similarly and will not be re-described below. Further, the CRFS shown in FIG. 2 may include additional or alternative components to those shown in FIG. 1.

Liquid fuel is sourced or stored in the fuel tank (e.g., fuel storage tank). The low-pressure fuel pump is in fluidic communication with the fuel tank. In the embodiment shown in FIG. 2, the low-pressure fuel pump is disposed outside of the fuel tank and pumps fuel through a suction device or feature. Operation of the low-pressure fuel pump is regulated by the controller. As described above, when power to the low-pressure fuel pump is turned off, the low-pressure side of the CRFS (e.g., all fluid conduits and components upstream of a high-pressure fuel pump) does not hold fluid pressure and instead the pressure decreases below priming or operating pressure.

Liquid fuel is pumped by the low-pressure fuel pump from the fuel tank to two high-pressure fuel pumps through the low-pressure conduit. Specifically, the low-pressure fuel pump pumps fuel to a first high-pressure fuel pump 202 coupled to a first high-pressure fuel rail 206 and a second high-pressure fuel pump 204 coupled to a second high-pressure fuel rail 208. The first and second high-pressure fuel pumps may operate similarly to the high-pressure fuel pump described above with reference to FIG. 1. For example, each of the first high-pressure fuel pump and second high-pressure fuel pump may be multi-piston pumps, with each piston/cylinder supplying fuel to an accumulator of the respective high-pressure fuel pump, where flow of fuel from each piston is controlled by a respective check valve. The low-pressure conduit may include a fuel filter 224. In FIG. 2, the fuel filter is shown downstream of the low-pressure fuel pump; however, in alternate embodiments the fuel filter may be disposed in an alternate location in the low-pressure conduit.

The low-pressure fuel pump is decoupled from the drives of the first and second high-pressure fuel pumps such that the pumps may operate independently from one another (e.g., power to the low-pressure fuel pump may be shut off while the first and second high-pressure fuel pumps continue to operate). In an alternate embodiment, the low-pressure fuel pump may be mechanically driven by one or both of the high-pressure pumps and thus the low-pressure fuel pump may not operate independently from the high-pressure fuel pump(s). As shown in FIG. 2, a first IMV 220 is coupled upstream of the first high-pressure fuel pump and a second IMV 222 is coupled upstream of the second high-pressure fuel pump. Thus, the low pressure conduit couples to a second low pressure conduit 218 extending between an inlet to the first IMV and an inlet to the second IMV. The first and second IMVs may adjust a flow rate of fuel that is provided to the first and second high-pressure fuel pumps, respectively, and further to the first and second high-pressure fuel rails, respectively, for distribution to a plurality of fuel injectors for fuel injection.

In an alternate embodiment, a single IMV may be disposed in the low-pressure conduit upstream of both the first and second high-pressure fuel pumps to adjust a flow rate of fuel that is provided to the first and second high-pressure fuel pumps and further to the first and second high-pressure fuel rails for distribution to a plurality of fuel injectors for fuel injection into a plurality of engine cylinders. In another embodiment, the CRFS may not include an IMV, and fuel pressure delivered to the injectors may instead be controlled on the high-pressure side of the system (e.g., downstream from each of the first and second high-pressure fuel pumps).

The high-pressure fuel pumps increase fuel pressure from a lower pressure to a higher pressure. The first high-pressure fuel pump delivers fuel to the first high-pressure fuel rail through a high-pressure conduit 210. A first set of fuel injectors 212 for a first bank of the engine are in fluidic communication with the first high-pressure fuel rail 206. Each of the first set of fuel injectors 212 delivers fuel to one of a plurality of engine cylinders of a first bank of the engine (similar to the engine of FIG. 1). Operation of the first set of fuel injectors 212 is regulated by the controller. In the embodiment of FIG. 2, the engine includes six fuel injectors and six engine cylinders on each engine bank. In alternate embodiments, more or fewer fuel injectors and engine cylinders can be included in the complete engine, or in each bank of the engine.

Similarly, the second high-pressure fuel pump delivers fuel to the second high-pressure fuel rail through a high-pressure conduit 214. A second set of fuel injectors 216 for a second bank of the engine are in fluidic communication with the second high-pressure fuel rail. Each of the second set of fuel injectors delivers fuel to one of a plurality of engine cylinders of a second bank of the engine. Operation of the second set of fuel injectors is regulated by the controller.

A respective pressure sensor is positioned downstream of each high-pressure fuel pump. As shown, a first pressure sensor 130$a$ is positioned in high-pressure conduit 210 and a second pressure sensor 130$b$ is positioned in high-pressure conduit 214. In one embodiment, suitable pressure sensors may be high-precision, fast-response sensors that measure pressure with a response rate of less than or equal to 0.5 ms, and/or at a rate of 2,000 times engine crank speed, for example.

Excess fuel in the fuel injectors returns to the fuel tank via a common fuel return (not shown). As such, the common fuel return is coupled to the fuel tank. In other embodiments, the CRFS may not include a common fuel return. In another embodiment, return fuel is fed back to a point upstream of the IMV. In yet another embodiment, return fuel is fed back to the inlet of the low-pressure fuel pump.

In one example, each of first high-pressure fuel pump and second high-pressure fuel pump includes four pumping chambers (and four corresponding check valves) and the engine includes 16 cylinders. Each cam of each pump may include two lobes, similar to the cam lobes of FIG. 1, such that each piston of each pump is actuated twice for each full rotation of the pump drive shaft. The pump drive shaft may be driven by the crankshaft of the engine. In an example, one actuation of a piston of the pump may occur for each combustion event in the engine. In an example, for a sixteen-cylinder engine, for each rotation of the crankshaft of the engine, eight cylinders may fire and eight pump piston actuation events may occur for each pump. In yet another example, the pump cam may include three or more lobes in order to meet the fueling (pressure and quantity) requirements of the engine.

In a multi-piston high-pressure fuel pump (such as the pumps described herein with respect to FIGS. 1 and 2), whether configured radially, axially, or in-line, fuel is pumped by discrete piston movements. Each piston goes through a suction phase and a pumping phase during its individual pumping event and the frequency of these pumping events depends (in the case of an in-line or radial pump) on the number of cam lobes acting on each piston per pump shaft revolution and on the speed of the pump shaft drive, or in the case of a swashplate design, solely on the speed of the pump shaft drive. Although all of the pistons may flow into a common plenum (e.g., accumulator), it is possible to discern the individual pressure pulses resulting from the individual piston pumping events through the use of a highly-sensitive, high-resolution, high-accuracy, highly-repeatable rail pressure sensor, which is included to provide feedback and control rail pressure.

There are several high-pressure fuel pump degradation mechanisms which can limit the ability of an engine to reach full power, can result in defaulting to a limp home mode, can cause an aborted mission, or can be misinterpreted by control algorithms as a fuel leak. These include leakage past a worn plunger/sleeve, poor check valve sealing due to contamination, cavitation, metallurgical breakdown, corrosion, and one or more degraded cam lobes. These modes may not be recognized until the operation of the engine has degraded significantly.

The one or more IMVs in the fuel system may also become degraded over time and may cause the engine to default to stopping or not starting. Notification of an engine issue may be provided as a diagnostic code but the diagnostic code may not differentiate between a degradation of the high-pressure fuel pump, a fuel leak, or an IMV issue. Thus, a prolonged period of time may be spent testing the high-pressure fuel pump, IMV, and/or detecting leaks. In some examples, when the source of degradation is not fully realized, the IMV may be replaced without prior confirmation that the IMV is not operating as expected, only to determine that the IMV is not the underlying cause of the diagnostic code.

Evaluation of a condition of the IMV may be provided by overlaying a current decay signal the IMV with an expected decay signal, subsequent to an abrupt change in an electrical circuit of the IMV, such as a switching of the IMV from being electrically driven to electrically undriven. For example, when undriven and no current is applied to the electrical circuit, the IMV may normally, e.g., as a default position, be open, allowing a maximum amount of fuel to be delivered to the downstream high-pressure fuel pump as allowable by a configuration of the IMV. Upon applying a current, the IMV may decrease an amount of metered fuel flowed to the high-pressure fuel pump, the extent to which flow is decreased determined by the current flow. In one example, as described above, the IMV includes a solenoid which generates a magnetic field when the current is applied. The magnetic field drives movement of a plunger against a spring, where the spring maintains the plunger in a fully open position when the IMV is undriven.

A response time of the IMV when the IMV transitions from driven to undriven may be monitored in real-time and compared to an expected response time, estimated based on current engine conditions. Deviation of the IMV response time from the estimated response time may confirm degradation of the IMV, thereby precluding unnecessary replacement of the IMV. Further details of the diagnosis of the IMV are provided with reference to FIGS. 3-11.

In addition, identification of "sticking" of the IMV may be enabled by monitoring the current decay signal. In some instances, debris may enter the IMV and cause the IMV to resist movement. An inflection in the decay signal may indicate a sticky IMV, as described below with reference to FIGS. 7, 8, and 11.

Turning now to FIG. 3, graph 300 depicts an expected rise time and fall time of an IMV, such as the IMV of FIGS. 1 and 2, and IMVs of FIG. 2, incorporated in an engine, such as shown in FIGS. 1 and 2. The rise time may be an amount of time a pulse takes to increase from a low to high voltage. The rise time may be measured between 10% to 90% of a full voltage of the pulse. The fall time may be an amount of time for the pulse to decrease from the high voltage to the low voltage, e.g., from 90% to 10% of the full voltage of the pulse. The rise and fall times may be equal and may be determined with an instrument, such as an oscilloscope, for the IMV.

The determined rise time or fall time may be converted to a time constant $\tau$. For example, $\tau$ may be less than 13.64 ms. In other examples, $\tau$ may vary based on a particular IMV design. For example, $\tau$ may be up to approximately 60 ms. The time constant may be used to model the response time of the IMV based on a unit-step response of a first-order system, in which the response may be assumed to progress as $1-\exp(-\tau)$. The IMV may be modeled as an RL circuit where a current flow at a solenoid of the IMV may indicate a position of the solenoid. The modeled response time is shown in graph 400 in FIG. 4.

Graph 400 depicts current, along the y-axis, with respect to time, along the x-axis, at the IMV solenoid for the RL circuit. At t1, the solenoid may be transitioned from electrically driven to electrically undriven. For example, a current may be initially applied to the IMV to decrease an amount of fuel delivered to a high-pressure fuel pump. Reduced fuel flow to the high-pressure fuel pump may be requested during, as an example, a vehicle deceleration event, leading to decreased engine load. However, various other events and scenarios may lead to a demand for reduced fuel metering. The deceleration event may terminate and an increased load may be detected at the engine. The IMV may be instructed, e.g., by a controller such as the controller of FIGS. 1 and 2, to increase fuel delivery to the high-pressure fuel pump to maintain a stoichiometry at the engine. The current may therefore be removed from the solenoid, allowing a plunger of the solenoid to adjust to an open (or more open) position. In one example, transitioning the solenoid to fully undriven may allow the plunger to adjust to a fully open position.

The removal of the applied voltage from the solenoid occurs at t1 of graph 400. Between t1 and t2, the current signal may decay but the IMV may not begin to move. The interval between t1 and t2 may represent an electrical time response of the solenoid. At t2, the current signal depicts a mechanical, undriven current decay which may be used to compare to a measured current signal decay of the IMV, as described further below.

An actual current signal, e.g., a sampled current decay in real-time, of the IMV is shown in graph 500 in FIG. 5. The voltage is similarly removed at t1 and an electrical response time of the solenoid occurs between t1 and t2. At t2, the current signal transitions to a mechanical response time. The mechanical response times of graph 400 and graph 500 may be compared to evaluate a condition of IMV.

As an example, graph 600 is shown in FIG. 6 plotting current signal relative to time for the IMV. Graph 600 may be either a modeled signal, e.g., as shown in FIG. 4, or a measured signal, e.g., as shown in FIG. 5. A first data point 602, a second data point 604, a third data point 606, and a fourth data point 608 may be determined. The first data point 602 may be a captured peak current within a buffer, identified by a peak current and/or peak index search. The buffer may be the time constant, $\tau$, multiplied by a factor of six where $\tau$ is determined from the IMV response. Accordingly, the buffer may be large enough to capture at least one period of an electrical driving (pulse-width modulation) frequency in addition to a full expected range of $\tau$ values for the first data point 602. With respect to time, the first data point 602 may be $\tau_0$.

As an example, the second data point 604 may be a time where the current has decayed by 63.2% of the captured peak current (e.g., corresponding to $1\tau$) and may be denoted as $\tau_1$. The third data point 606 may be a time where the current has decayed by 86.5% of the captured peak current (e.g., corresponding to $2\tau$) and the fourth data point 608 may be a time where the current has decayed by 95.0% of the captured peak current (e.g., corresponding to $3\tau$), represented as $\tau_2$ and $\tau_3$, respectively. Accordingly, the current value corresponding to a given $\tau$ value may be determined by multiplying the captured peak current by the percent current decay from the captured peak current.

A mechanical response time of a solenoid of the IMV may begin at $\tau_1$, therefore $\tau_2$ and $\tau_3$ also occur during the mechanical response time of the IMV. Index positions for each of the data points may be identified, e.g., along the x-axis, and converted to changes in time by implementing a search vectors backwards. For example, a first interval T1, representing a difference between $\tau_3$ and $\tau_2$, may be determined and a second interval T2, representing a difference between $\tau_2$ and $\tau_1$, may be determined. In instances where the IMV is not degraded, as shown in FIG. 4, T2 may be similar to T1. For example, T1 and T2 may each be within a threshold (such as 5%) of one another or another, determined value.

However, when T1 and T2 differ from one another or differ beyond the threshold of the determined value, the IMV may be deemed degraded and not operating as expected. A diagnostic flag indicating IMV maintenance or IMV replacement, such as a visual or audio indication, may be set to notify an operator. Furthermore, mitigating actions may be implemented, such as adjusting a check valve of a high-pressure fuel pump, positioned downstream of the IMV, to decrease fuel injection to engine combustion chambers and reduce torque. A minimum amount of engine power may be provided, for example, to enable the engine to navigate a vehicle to a desired location where the engine may then be shut off, the engine power may be limited below a threshold engine power, or, in examples where two IMVs are included, the engine may be operated without the degraded IMV (e.g., the IMV determined to be degraded) and the engine may instead be operated with a single IMV (e.g., the IMV not deemed degraded).

A condition of an IMV may be further evaluated to determine if the IMV is exhibiting resistance to movement when commanded to adjust between open and closed positions. For example, debris may enter a solenoid of the IMV and interfere with sliding of a plunger of the solenoid, resulting in a "sticky" or stuck IMV. Additionally or alternatively, the IMV may become mechanically degraded over time due to wear and become stuck in a position, causing fuel rail pressure to deviate from a desired pressure to provide stoichiometry at an engine. Additionally or alternatively, the IMV may become chemically degraded (e.g., corroded) over time due to prolonged storage.

A current decay signal may be sampled during transition of the IMV from driven to undriven and a signal peak detected by a peak current/peak index search, as described above. At the captured peak, filtering of the current may be initiated. In other words, the captured peak may be a peak current that is a starting point for filtering of subsequent collected data points of the IMV response time. Filtering may continue over an electrical and mechanical time response of the IMV until the current decays to an expected value indicating that the IMV is in a fully open position. For example, the signal may be sampled and filtered until the current decays to 0.5 A. If, during the sampled IMV response time, the measured, original current decay signal exceeds the filtered decay signal, an inflection is deflected. The inflection may be indicative of a stuck/sticky IMV.

As shown in FIG. 7 in a first graph 700, a sampled current decay of an IMV (e.g., an original current decay signal as measured at a solenoid of the IMV) is depicted at plot 702. The sampling is collected at a determined sampling rate and may be filtered with a finite impulse response (FIR) filter factor, each of the determined sampling rate and the FIR filter factor dependent on received testing data and/or a given ECU/engine application. The sampled current decay at plot 702 is further depicted at plot 704 following filtering with the FIR filter factor, plot 704 overlaid with plot 702 for comparison. As described above, a current peak is captured and indexed at t1, initiating filtering of the collected current decay signal. From t1 to t2, where the current decay reaches an expected current indicating that the IMV is fully open, plot 702 remains above plot 704. As such, the IMV may be determined to be operating as expected, without degradation or obstruction.

In contrast, graph 800, as shown in FIG. 8, depicts a current decay signal of a stuck/sticky IMV. Graph 800 includes a sampled current decay of the IMV at plot 802, the sampling collected at the determined sampling rate. Plot 802 is filtered with the FIR filter factor and the filtered signal is overlaid with plot 802 at plot 804 for comparison. Similar to graph 700, a current peak is captured at t1, initiating the filtering of the sampled current decay signal until t3. Between t1 and t2, plot 802 remains above plot 804. However, at t2, an inflection point occurs where the current level of plot 804 becomes higher than plot 802. A reversal of plot 802 and plot 804, with respect to current values, may arise from a resistance of a solenoid plunger of the IMV to movement. The resistance may result in a rise in current during the response time of the IMV.

Detection of the inflection point, e.g., as shown at t2 of graph 800, may be reported to a controller, e.g., the controller of FIGS. 1 and 2. An alert may be activated to notify an operator that the IMV is degraded. However, if no inflection point is detected, a current level of zero may be reported and the alert is not activated.

The plots shown in graphs 700 and 800 of FIG. 7 and, respectively, are non-limiting examples of data processing to diagnose the IMV. For example, the FIR filter factor may vary depending on testing data, a total number of IMVs in the fuel system, and/or predicted IMV operation (e.g., for a specific engine application). Furthermore, other types of signal processing filters may be applied to the sampled current decay signal.

In this way, degradation of an IMV may be diagnosed. A response time of the IMV may be evaluated by monitoring a current decay signal of the IMV when the IMV transitions from an electrically driven state to an electrically undriven state. A mechanical response time may be identified from the current decay signal and compared to a modeled mechanical response time. Deviations from the modeled mechanical response time may be indicative of degradation.

In addition, resistance of the IMV to movement, arising from debris present in the IMV or mechanical/chemical wear of the IMV, may be determined by similarly collecting current signal decay when the IMV is transitioned from driven to undriven. The current signal may be filtered and the filtered signal overlaid with the sampled current signal. Detection of inflection points may indicate that the IMV is sticky or stuck, causing a rise in current during the response time of the IMV.

By diagnosing a condition of the IMV, degradation of the IMV may be differentiated from degradation of a high-pressure fuel pump or presence of fuel leaks in a fuel system. Costly replacement of the IMV may be circumvented when the IMV is not a cause of an issue in the fuel system. Continual monitoring and updating of a status of the IMV may be provided each time the IMV is switched from electrically driven, where the IMV reduces fuel flow to the high-pressure fuel pump, to electrically undriven, where the IMV is fully opened to flow a greater amount of fuel to the high-pressure fuel pump. For example, the IMV may be diagnosed during each acceleration event or each time increased torque is requested. In other examples, monitoring of transitions from the electrically undriven status to the electrically driven status may also be utilized to gauge IMV health.

In some examples, an operator may initiate diagnosis of the IMV by requesting an IMV test to be performed via a controller. As another example, the IMV may be tested if a threshold period of time has elapsed since a previous diagnosis of the IMV or if an issue at the fuel system, such as a fuel rail pressure rising above or decreasing below an expected level, is detected.

Examples of routines for diagnosing an IMV are shown in FIGS. 9-11. Routine 900 of FIG. 9 depicts a process for actively initiating testing of the IMV, routine 1000 of FIG. 10 shows a process for automatically testing the IMV, and routine 1100 is a process for assessing whether the IMV is stuck or sticky and may be conducted in combination with routine 900 and routine 1000. The testing of the IMV described in FIGS. 9 and 10 may utilize collected data and data processing as shown in FIGS. 4-6 and evaluation of the IMV for being stuck/sticky may be determined based on data collection and processing as shown in FIGS. 7-8. The IMV may be positioned in a fuel system of an engine, such as the CRFS of FIG. 1 and CRFS 200 of FIG. 2, upstream of a high-pressure fuel pump and configured to meter fuel drawn into the high-pressure fuel pump. The fuel system may include more than one IMV and each IMV may be independently diagnosed. The IMV may include a solenoid with a movable plunger, where movement of the plunger adjusts an opening of the IMV and varies an amount of fuel delivered to the high-pressure fuel pump. Instructions for carrying out routines 900, 1000, and 1100, and the rest of the methods included herein may be executed by a controller, such as the controller of FIGS. 1 and 2, based on instructions stored on a memory of the controller and in conjunction with signals received from sensors of the fuel system, such as the sensors described above with reference to FIGS. 1 and 2.

Turning first to FIG. 9, at 902, the routine includes estimating engine operating conditions. For example, the controller may infer an air-to-fuel ratio at engine cylinders, fuel temperature, a fuel rail pressure, etc., from various sensors of the fuel system. The controller may obtain other data regarding engine conditions, such as engine speed, torque demand, boost, etc., from other sensors such as engine sensors 134 of FIG. 1.

At 904, the routine includes determining if a fuel system issue is detected. As shown in routine 900, an issue in the fuel system may be detected if a measured fuel pressure, e.g., as measured by a pressure sensor such as the first pressure sensor 130a or the second pressure sensor 130b of FIG. 2, deviates from an expected, estimated pressure. For example, the controller may refer to a look-up table providing expected fuel rail pressure based on an intake manifold pressure, AFR, throttle position, etc. The controller may compare the measured fuel rail pressure to the expected pressure and determine if the measure fuel rail pressure falls within an acceptable range of the expected pressure. In one embodiment, the acceptable range may be within a margin of 5%.

In other examples, other criteria may be assessed to determine if an issue is present in the fuel system. For example, a measured (actual) fuel flow may be determined within an acceptable range of an expected fuel flow, such as within a margin of 5%. The expected fuel flow may similarly be received by the controller from a look-up table based on one or more engine operating conditions. Additionally or alternatively, an issue may be indicated when a leak sensor included in the fuel system confirms no leak is present concurrent with high IMV demand.

If the fuel rail pressure is within the acceptable range of the expected pressure, the routine continues to step 906 to determine if an amount of time that has elapsed since the IMV was last tested surpasses a threshold amount of time. As an example, the threshold amount of time may be 1 hour, 2 hours, or may be determined based on whether the IMV has been tested since operating the engine. If the amount of elapsed time since a previous testing of the IMV does not reach or pass the threshold amount of time, the routine continues to step 908 continue operating the engine under current conditions. The routine returns to the start.

If the elapsed time reaches or passes the threshold amount of time, the routine may wait for an opportunistic window in which to diagnose the IMV (e.g., when high engine power is not expected over a duration of the diagnostic, such as when the engine is idling) and then proceeds to step 905 to electrically drive the IMV to a closed position. For example, a voltage may be applied to the solenoid to adjust the plunger to decrease the amount of fuel delivered to the high-pressure fuel pump. In the closed position, the IMV may provide a minimum amount of fuel to the high-pressure fuel pump to maintain operation of the engine but with reduced power output. The routine also proceeds to step 905 from step 904 if the measured fuel rail pressure is determined to not be within the acceptable range of the expected pressure.

From step 905, where IMV is adjusted to the closed position, the routine continues to step 910 to run a diagnostic test to evaluate a condition of the IMV. The diagnostic test includes opening the IMV and sampling a resulting current decay signal at step 912. The IMV may be opened by removing the applied voltage from the solenoid. The plunger slides, as compelled by a spring exerting a force on the plunger, to a more open position, increasing fuel flow to the high-pressure fuel pump. The IMV may maintained in the open, electrically undriven state until sufficient data points are collected during a response time of the IMV. For example, the IMV may be maintained undriven, regardless of engine operations, until the current signal decays to 5 A.

The diagnostic test also includes conducting a peak current/peak index search at step 914. Upon locating a peak in the current decay signal, time constants for signal decay to predefined current levels may be estimated. In one example, time constants when the signal has decayed by 63.2% ($\tau_1$), 86.5% ($\tau_2$), and 95.0% ($\tau_3$) may be obtained from indexed data points at each of the predefined current levels at 916, allowing a first interval T1, estimated by ($\tau_2$)-($\tau_1$), and a second time interval T2, estimated by ($\tau_3$)-($\tau_2$) to be determined. By comparing T1 to T2, a condition of the IMV may be inferred.

At step 918, the routine includes determining if values of T1 and T2 are each within a threshold margin of one another or another determined time interval. In some examples, the threshold margin may be 5%. If T1 and T2 are determined within the threshold margin, e.g., within 5%, of one another or the determined time interval, the routine continues to 920 to continue engine operation under current conditions. The routine returns to the start.

If T1 and T2 are determined outside the threshold margin, e.g., outside of 5%, of one another or the determined time interval the IMV may be degraded and the routine proceeds to step 922 to send a notification alerting an operator that the IMV may not be operating as expected. For example, an indicator on a dashboard or control panel may be illuminated, an audible warning may be activated, etc. Furthermore, mitigating actions may be performed to compensate for a reduced performance of the IMV. Engine power output may be reduced for example or, when multiple IMVs are included in the fuel system, the IMV determined to be degraded may be deactivated and the fuel system may proceed to operate with those IMVs not deemed degraded. At step 924, the routine includes determining if the poor IMV performance is due to the IMV being stuck or sticky, as shown at FIG. 11 and described further below.

In some examples, conducting routine may result in fuel rail pressure, and therefore engine power output, fluctuating beyond desired levels to accommodate a torque demand, e.g., decreasing during commanded closing of the IMV and increasing during commanded opening of the IMV. Engine performance may thus be degraded during diagnosis of the IMV. As such, the operator or controller may opportunistically test the IMV during events where engine performance is not prioritized, e.g., when the engine is idling.

Turning now to FIG. 10, routine 1000 depicts an automated diagnosis of the condition of the IMV, conducted during operation of the engine when conditions are conducive to testing of the IMV. At step 1002, the routine includes estimating engine operating conditions. For example, the controller may infer an air-to-fuel ratio at engine cylinders, fuel temperature, a fuel rail pressure, etc., from various sensors of the fuel system. The controller may obtain other data regarding engine conditions, such as engine speed, torque demand, boost, etc., from other sensors such as engine sensors 134 of FIG. 1.

At step 1004, the routine includes determining if the IMV is in the electrically driven closed position. The controller may detect the position of the IMV based on a current measured at the solenoid of the IMV. If a current is present, the IMV is electrically driven and in the closed position. If the current is not present, the IMV is undriven and open. In the closed position, the IMV may provide a minimum amount of fuel to the high-pressure fuel pump to maintain operation of the engine but with reduced power output. The IMV may be in the closed position during a request for reduced vehicle speed, when the engine is in an idle mode, etc. If the IMV is not closed, the routine continues engine operation under current conditions at step 1006. The routine then returns to the start.

If the IMV is closed, the routine continues to 1008 determine if an increase in fuel metering and fuel rail pressure is requested or anticipated. The increase may be requested when an increase in engine speed and/or torque is demanded when, for example, vehicle acceleration or increased engine loads, e.g., uphill navigation, is desired or expected to be imminent, based on a navigation system or terrain map, for example. If the increase in fuel metering is not requested, the routine returns to step 1004. If the increase in fuel metering is requested, the routine proceeds to step 1010 to determine if the anticipated increase in fuel delivery to the high-pressure fuel pump provides sufficient data points for diagnosis of the IMV. For example, in order to assess whether the IMV is mechanically degraded, an undriven response time of the IMV may be monitored until the current signal decays to a current level corresponding to when the IMV is fully open. For example, when the IMV is fully open, the current signal may decay to 5 A.

In some instances, the increase in fuel metering may correspond to a demand for only a small increase in fuel drawn into the high-pressure fuel pump. As such, the IMV may not be fully opened and rely on a small amount of current to maintain the plunger of the solenoid in a desired position. The data from the transitioning of the IMV from the closed position to a more open but not fully open position may not provide sufficient data points to accurately assess the IMV. Thus, if the sample data set is estimated to not provide enough data for reliable evaluation of the IMV, the routine returns to step 1004.

If the sampled data set is anticipated to provide sufficient data points to test the IMV, the routine proceeds to step 1012 to run a diagnostic test to determine if the IMV is mechanically degraded. The diagnostic test includes opening the IMV and sampling a resulting current decay signal at step 1014. The IMV may be opened by terminating the current flow to the solenoid. The plunger slides, as compelled by a spring exerting a force on the plunger, to a more open position, thus increasing fuel flow to the high-pressure fuel pump. The IMV may be maintained in the open, electrically undriven state at least until sufficient data points are collected during a response time of the IMV. For example, the IMV may be maintained undriven, regardless of engine operations, until the current signal decays to 5 A.

The diagnostic test also includes conducting a peak current/peak index search at step 1016. Upon locating a peak in the current decay signal, time constants for signal decay to predefined current levels may be estimated. In one example, time constants when the signal has decayed by 63.2% ($\tau_1$), 86.5% ($\tau_2$), and 95.0% ($\tau_3$) may be indexed at 1018, allowing a first interval T1, estimated by ($\tau_2$)-($\tau_1$), and a second time interval T2, estimated by ($\tau_3$)-($\tau_2$) to be determined. By comparing T1 to T2, a condition of the IMV may be inferred.

At step 1020, the routine includes determining if values of T1 and T2 are each within a threshold margin of one another or another determined time interval. In some examples the threshold margin may be selected to be about 5%. If T1 and T2 are determined within the threshold margin, e.g., within 5%, of one another or the determined time interval, the routine continues to step 1006 to continue engine operation under current conditions. The routine returns to the start.

If T1 and T2 are determined to be outside of the threshold margin, e.g., outside of 5%, of one another or the determined time interval, the IMV may be deemed degraded and the routine proceeds to step 1022 to send a notification alerting an operator that the IMV may not be operating as expected. For example, an indicator on a dashboard or control panel may be illuminated, an audible warning may be activated, etc. Furthermore, mitigating actions may be performed to compensate for a reduced performance of the IMV. Engine power output may be reduced, for example, or, when multiple IMVs are included in the fuel system, the IMV determined to be degraded may be deactivated and the fuel system may proceed to operate with those IMVs not deemed degraded. At 1024, the routine includes determining if the poor IMV performance is due to the IMV being stuck or sticky, as shown at FIG. 11.

A routine 1100 describes a process for further evaluating if the IMV, determined to be mechanically degraded, is stuck or sticky. As described above, when stuck or sticky, the plunger of the solenoid may resist movement due to presence of, for example, debris in the solenoid. The routine may be included in both routines described in FIGS. 9 and 10 as an additional or supplemental test.

At step 1102, the routine includes using results from the peak current/peak index search performed at step 914 and step 1016 of the earlier routines to index a peak in the sampled current decay signal. The current decay signal may be sampled, e.g., data points collected, at a frequency of 4 kHz, for example. The sampled data may be filtered at step 1104 using a signal processing filter. Suitable filters may include a FIR filter at a filter factor of 0.6. Alternatively, a different filter factor or a different signal processing filter may be used.

At step 1106, the routine includes determining if an inflection point is detected. The inflection point is detected when the sampled current data becomes higher in current level than the filtered data which may occur when the IMV experiences resistance to commanded movement, resulting in an increase in current. If the deflection point is not detected, the routine returns to the routine of FIG. 9 or FIG. 10. If the inflection point is detected, the routine proceeds to step 1108 to provide a notification that the IMV is stuck or sticky. The notification may be in addition to the alert indicating that the IMV is degraded, as depicted at routines 900 and 1000. This routine, or sub-routine, then returns to another routine, such as those described with reference to FIGS. 9 and 10.

Another aspect of the present disclosure provides support for embodiments which diagnose IMV health by driving the IMV from an electrically de-energized (undriven) state to an electrically energized (driven) state. For example, a healthy IMV may be indicated by an initial response resembling a time constant of a mechanical portion of the IMV, where inductance is based on physical movement of the IMV. Further, an unhealthy ("stuck") IMV may be indicated by an initial response resembling a time constant of an electrical portion (e.g., inductance, resistance) of the IMV, where inductance is not based on physical movement of the IMV.

In this way, methods are provided for diagnosing inlet metering valve (IMV) health. In some examples, an actual mechanical response time of the IMV may be monitored for deviations from a modeled, expected mechanical response time during a transition from an electrically driven state to an electrically undriven state. In one example, the modeled, expected mechanical response time may correspond to a unit-step response of a first order system. A technical effect of comparing the actual mechanical response time to the modeled, expected mechanical response time is that deviations may be ascribed to a degraded IMV which may require maintenance or replacement. Accordingly, upon detection of the degraded IMV, an operator may be notified and/or mitigating actions may be performed. In additional or alternative examples, a current signal may be sampled and the sampled current signal may be filtered, whereby the sampled current signal may be overlaid with the filtered current signal. A technical effect of comparing the sampled current signal to the filtered current signal is that inflection points therebetween may be ascribed to a "sticky" or "stuck" IMV which may require maintenance or replacement. Accordingly, upon detection of the sticky or stuck IMV, an operator may be notified and/or mitigating actions may be performed.

The disclosure also provides support for a method for a valve, the method comprising: reducing electrical driving of the valve, monitoring a response time of the valve in real-time responsive to the reducing, and determining if the valve is degraded based on a response of valve current over a duration, the duration beginning after an initial decrease in current caused by the reducing. In a first example of the method, reducing electrical driving of the valve includes terminating a current flow through a solenoid of the valve. In a second example of the method, optionally including the first example, terminating the current flow through the solenoid of the valve includes adjusting the valve from a closed position, where the valve is electrically driven and fuel flow to a high-pressure fuel pump is reduced, to an open position, where the valve is electrically undriven and fuel flow to the high-pressure fuel pump is increased, and wherein the high-pressure fuel pump is arranged downstream of the valve. In a third example of the method, optionally including one or both of the first and second examples, monitoring the response time of the valve includes sampling a current signal decay of a solenoid of the valve. In a fourth example of the method, optionally including one or more or each of the first through third examples, the method further comprises: conducting at least one of a peak current and a peak index search to locate a peak during the response time of the valve. In a fifth example of the method, optionally including one or more or each of the first through fourth examples, the method further comprises: indexing data points at predefined levels of current decay during the response time of the valve. In a sixth example of the method, optionally including one or more or each of the first through fifth examples, indexing data points at the predefined levels of current decay includes indexing a first data point where the peak current decays to 63.2%, a second data point where the peak current decays to 86.5% and a third data point where the peak current decays to 95.0%. In a seventh example of the method, optionally including one or more or each of the first through sixth examples, determining if the valve is degraded includes converting the first, second, and third data points to a first, a second, and a third time constant, respectively. In an eighth example of the method, optionally including one or more or each of the first through seventh examples, determining if the valve is degraded further comprises comparing a first time interval, where the first time interval is a difference between the second and the first time constants, to a second time interval, where the second time interval is a difference between the third and the second time constants. In a ninth example of the method, optionally including one or more or each of the first through eighth examples, determining if the valve is degraded includes confirming that the valve is not degraded when the first and the second time intervals are within a threshold margin of one another or a determined time interval, and confirming that the valve is degraded when the first and the second time intervals are outside the threshold margin of one another or the determined time interval and wherein the threshold margin is within 5%.

The disclosure also provides support for a method for a valve, the method comprising sampling a response time of the valve to obtain a sampled current decay signal of the valve when electrical driving of the valve is reduced, filtering the sampled current decay signal of the valve to obtain a filtered current decay signal, and overlaying the filtered current decay signal with the sampled current decay signal to determine if the valve is exhibiting a resistance to movement based on a presence of an inflection point in the overlaid filtered and sampled current decay signals, wherein the resistance of movement of the valve is indicative of degradation of the valve. A first example of the method further includes wherein sampling the response time of the valve includes collecting data points until the sampled current decay signal falls to a current level indicating that the valve is fully open. A second example of the method, optionally including the first example of the method, further includes wherein filtering the sampled current decay signal includes locating a peak in the sampled current decay signal via a peak current or peak index search and using the peak as a starting point for filtering the sampled current decay signal. A third example of the method, optionally including one or more of the first and second examples of the method, further includes wherein filtering the sampled current decay signal includes applying a filter factor based on testing data and/or predicted valve operation. A fourth example of the method, optionally including one or more of the first through third examples of the method, further includes wherein determining if the valve is resisting movement includes confirming the presence of the inflection point and wherein the inflection point is a point where a current level of the sampled current decay signal rises above a current level of the filtered current decay signal. A fifth example of the method, optionally including one or more of the first through fourth examples of the method, further includes wherein determining if the valve is exhibiting the resistance to movement includes confirming that the valve is not resisting movement and not degraded when no inflection point is present.

The disclosure provides support for a method for diagnosing a fuel system, the method comprising monitoring a current signal decay of an inlet metering valve (IMV) of the fuel system when electrical driving of the IMV is reduced to determine if the IMV is degraded, and upon confirming the IMV is degraded, filtering the monitored current signal and overlaying the filtered current signal with the monitored current signal to determine if a degradation of the IMV is due to resistance of a solenoid of the IMV to motion based on a presence of an inflection point in the overlaid filtered and monitored current decay signals. A first example of the method further includes wherein monitoring the current signal decay of the IMV includes electrically driving the IMV to close prior to reducing the electrical driving of the IMV when at least one of a pressure at a fuel rail of the fuel system deviating from an expected pressure and a time elapsed since a previous monitoring of the current signal decay of the IMV passing a threshold time period is detected. A second example of the method, optionally including the first example of the method, further includes wherein monitoring the current signal decay of the IMV includes automatically reducing the electrical driving of the IMV to diagnose a condition of the IMV when the IMV is in a closed position and wherein when in the closed position, the IMV is electrically driven. A third example of the method, optionally including one or more of the first and second examples of the method, further comprises performing mitigating actions and setting a diagnostic flag when the IMV is determined to be degraded, wherein the mitigating actions include at least one of reducing a power output of an engine and operating the engine without the IMV determined to be degraded, and/or wherein the diagnostic flag indicates IMV maintenance or IMV replacement.

As used herein, an element or step recited in the singular and proceeded with the word "a" or "an" do not exclude plural of said elements or steps, unless such exclusion is indicated. Furthermore, references to "one embodiment" of the invention do not exclude the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller. As used herein, the term "approximately" means plus or minus five percent of a given value or range unless otherwise indicated.

This written description uses examples to disclose the invention, including the best mode, and also to enable a person of ordinary skill in the relevant art to practice the invention, including making and using devices or systems and performing the incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for a valve, the method comprising:
reducing electrical driving of the valve;
monitoring a response time of the valve in real-time responsive to the reducing; and
determining if the valve is degraded based on a response of valve current over a duration, the duration beginning after an initial decrease in current caused by the reducing.

2. The method of claim 1, wherein reducing electrical driving of the valve includes terminating a current flow through a solenoid of the valve.

3. The method of claim 2, wherein terminating the current flow through the solenoid of the valve includes adjusting the valve from a closed position, where the valve is electrically driven and fuel flow to a high-pressure fuel pump is reduced, to an open position, where the valve is electrically undriven and fuel flow to the high-pressure fuel pump is increased, and wherein the high-pressure fuel pump is arranged downstream of the valve.

4. The method of claim 1, wherein monitoring the response time of the valve includes sampling a current signal decay of a solenoid of the valve.

5. The method of claim 1, further comprising conducting at least one of a peak current and a peak index search to locate a peak during the response time of the valve.

6. The method of claim 5, further comprising indexing data points at predefined levels of current decay during the response time of the valve.

7. The method of claim 6, wherein indexing data points at the predefined levels of current decay includes indexing a first data point where the peak current decays to 63.2%, a second data point where the peak current decays to 86.5% and a third data point where the peak current decays to 95.0%.

8. The method of claim 7, wherein determining if the valve is degraded includes converting the first, second, and third data points to a first, a second, and a third time constant, respectively.

9. The method of claim 8, wherein determining if the valve is degraded further comprises comparing a first time interval, where the first time interval is a difference between the second and the first time constants, to a second time interval, where the second time interval is a difference between the third and the second time constants.

10. The method of claim 9, wherein determining if the valve is degraded includes confirming that the valve is not degraded when the first and the second time intervals are within a threshold margin of one another or a determined time interval, and confirming that the valve is degraded when the first and the second time intervals are outside the threshold margin of one another or the determined time interval and wherein the threshold margin is within 5%.

11. A method for an inlet metering valve (IMV), the method comprising:
sampling a response time of the IMV to obtain a sampled current decay signal of the IMV when electrical driving of the IMV is reduced;
filtering the sampled current decay signal of the IMV to obtain a filtered current decay signal; and
overlaying the filtered current decay signal with the sampled current decay signal to determine if the IMV is exhibiting a resistance to movement based on a presence of an inflection point in the overlaid filtered and sampled current decay signals, wherein the resistance of movement of the IMV is indicative of degradation of the IMV.

12. The method of claim 11, wherein sampling the response time of the IMV includes collecting data points until the sampled current decay signal falls to a current level indicating that the IMV is fully open.

13. The method of claim 11, wherein filtering the sampled current decay signal includes locating a peak in the sampled current decay signal via a peak current or peak index search and using the peak as a starting point for filtering the sampled current decay signal.

14. The method of claim 11, wherein filtering the sampled current decay signal includes applying a filter factor based on testing data and/or predicted IMV operation.

15. The method of claim 11, wherein determining if the IMV is resisting movement includes confirming the presence of the inflection point and wherein the inflection point is a point where a current level of the sampled current decay signal rises above a current level of the filtered current decay signal.

16. The method of claim 15, wherein determining if the IMV is exhibiting the resistance to movement includes confirming that the IMV is not resisting movement and not degraded when no inflection point is present.

17. A method for diagnosing a fuel system, the method comprising;
monitoring a current signal decay of an inlet metering valve (IMV) of the fuel system when electrical driving of the IMV is reduced to determine if the IMV is degraded; and
upon confirming the IMV is degraded, filtering the monitored current signal and overlaying the filtered current signal with the monitored current signal to determine if a degradation of the IMV is due to resistance of a solenoid of the IMV to motion based on a presence of an inflection point in the overlaid filtered and monitored current decay signals.

18. The method of claim 17, wherein monitoring the current signal decay of the IMV includes electrically driving the IMV to close prior to reducing the electrical driving of the IMV when at least one of a pressure at a fuel rail of the fuel system deviating from an expected pressure and a time elapsed since a previous monitoring of the current signal decay of the IMV passing a threshold time period is detected.

19. The method of claim 17, wherein monitoring the current signal decay of the IMV includes automatically reducing the electrical driving of the IMV to diagnose a condition of the IMV when the IMV is in a closed position and wherein when in the closed position, the IMV is electrically driven.

20. The method of claim 17, further comprising performing mitigating actions and setting a diagnostic flag when the IMV is determined to be degraded,
wherein the mitigating actions include at least one of reducing a power output of an engine and operating the engine without the IMV determined to be degraded, and/or
wherein the diagnostic flag indicates IMV maintenance or IMV replacement.

* * * * *